United States Patent
Miles

(10) Patent No.: US 8,401,137 B2
(45) Date of Patent: Mar. 19, 2013

(54) JITTER EVALUATION

(75) Inventor: Barry Donald Ruberry Miles, London (GB)

(73) Assignee: Phabrix Limited, Thatcham, Berkshire (GB)

( * ) Notice: Subject to any disclaimer, the term of this patent is extended or adjusted under 35 U.S.C. 154(b) by 494 days.

(21) Appl. No.: 12/584,470

(22) Filed: Sep. 4, 2009

(65) Prior Publication Data
US 2010/0061435 A1    Mar. 11, 2010

(30) Foreign Application Priority Data
Sep. 5, 2008   (GB) .................................. 0816194.5

(51) Int. Cl.
*H04L 7/00*   (2006.01)
(52) U.S. Cl. ....................................................... 375/355
(58) Field of Classification Search ................... 375/355
See application file for complete search history.

(56) References Cited

U.S. PATENT DOCUMENTS

| | | | |
|---|---|---|---|
| 2002/0186804 A1* | 12/2002 | Dorschky et al. ............. | 375/376 |
| 2003/0223487 A1* | 12/2003 | Fisher ............................ | 375/226 |
| 2007/0121714 A1* | 5/2007 | Baker et al. .................... | 375/224 |

FOREIGN PATENT DOCUMENTS
JP    63/109638    5/1988

* cited by examiner

*Primary Examiner* — David C. Payne
*Assistant Examiner* — Tanmay Shah
(74) *Attorney, Agent, or Firm* — James Creighton Wray

(57) ABSTRACT

A jitter evaluation apparatus for receiving a digital test signal from which a clock signal is recovered, is shown. A clock recovery circuit (401) recovers a clock signal from the test signal and a synchronization circuit generates a synchronized system clock signal from said recovered clock signal. A sinusoid generator (403) generates a sinusoid signal from the synchronized system clock signal and a sampling analog to digital converter (404) samples the sinusoid signal by the recovered clock signal to provide sinusoid samples further comprising: A numerically controlled oscillator (401) is configured to produce sine values and cosine values in response to receiving an input from the system clock signal and a first multiplier (412) is configured to produce a first product of the sinusoid samples and the sine values. In addition, a second multiplier is configured to produce a second product of the sinusoid samples and the cosine values. Furthermore, a co-ordinate rotation device (416) is configured to receive said first product via a first low pass filter (414) and to receive said second product via a second low pass filter (415) to produce an output indicative of jitter phase.

14 Claims, 4 Drawing Sheets

JITTER EVALUATION

This application claims the benefit of GB Application No. 0816194.5 filed Sep. 5, 2008, which is hereby incorporated by reference in its entirety.

CROSS REFERENCE TO RELATED APPLICATIONS

This application represents the first application for a patent directed towards the invention and the subject matter.

BACKGROUND OF THE INVENTION

1. Field of the Invention

The present invention relates to jitter evaluation apparatus for receiving a digital test signal from which a clock signal is recovered, of the type comprising: a clock recovery circuit for recovering a recovered clock signal from said test signal; a synchronisation circuit for generating a synchronised system clock signal from said recovered clock signal; a sinusoid generator for generating a sinusoid signal from said synchronised system clock signal and a sampling analog to digital converter for sampling said sinusoid signal by said recovered clock signal to provide sinusoid samples.

The present invention also relates to a method for evaluating jitter.

2. Description of the Related Art

Systems for jitter evaluation are known in which a digital test signal is received, possibly from a device under test, from which a clock signal is recovered. An accurate system clock signal is generated from the recovered clock signal and a generator generates a sine wave synchronised to the accurate system clock signal. An analog to digital converter converts a sinusoid signal by sampling said signal based on the recovered clock signal. Thus, the sinusoid is generated by the accurate clock and then sampled by the recovered clock such that the recovered samples convey the inherent jitter.

When conveying high definition digital video signals it is known for these signals to include timing jitter in a low frequency range above 10 hz along with alignment jitter at frequencies above 100 khz. For a new device under test to be considered acceptable, both of these jitter components must have peak-to-peak values that lie below specified limits.

A known problem with test equipment of the aforesaid type is that sophisticated devices are often required in order to evaluate jitter components at the high frequencies used for high definition digital video transmission. Furthermore, further complications arise in terms of inherent accuracy and requirements for calibration.

BRIEF SUMMARY OF THE INVENTION

According to an aspect of the present invention, there is provided jitter evaluation apparatus of the aforesaid type, further comprising a numerically controlled oscillator configured to produce sine values and cosine values in response to receiving an input from said system clock signal; a first multiplier configured to produce a first product of said sinusoid samples and said sine values; a second multiplier configured to produce a second product of said sinusoid samples and said cosine values; and a co-ordinate rotation device configured to receive said first product via a first low pass filter and to receive said second product via a second low pass filter to produce an output indicative of jitter phase.

DESCRIPTION OF A BEST MODE FOR CARRYING OUT THE INVENTION

FIG. 1

Figure 1:
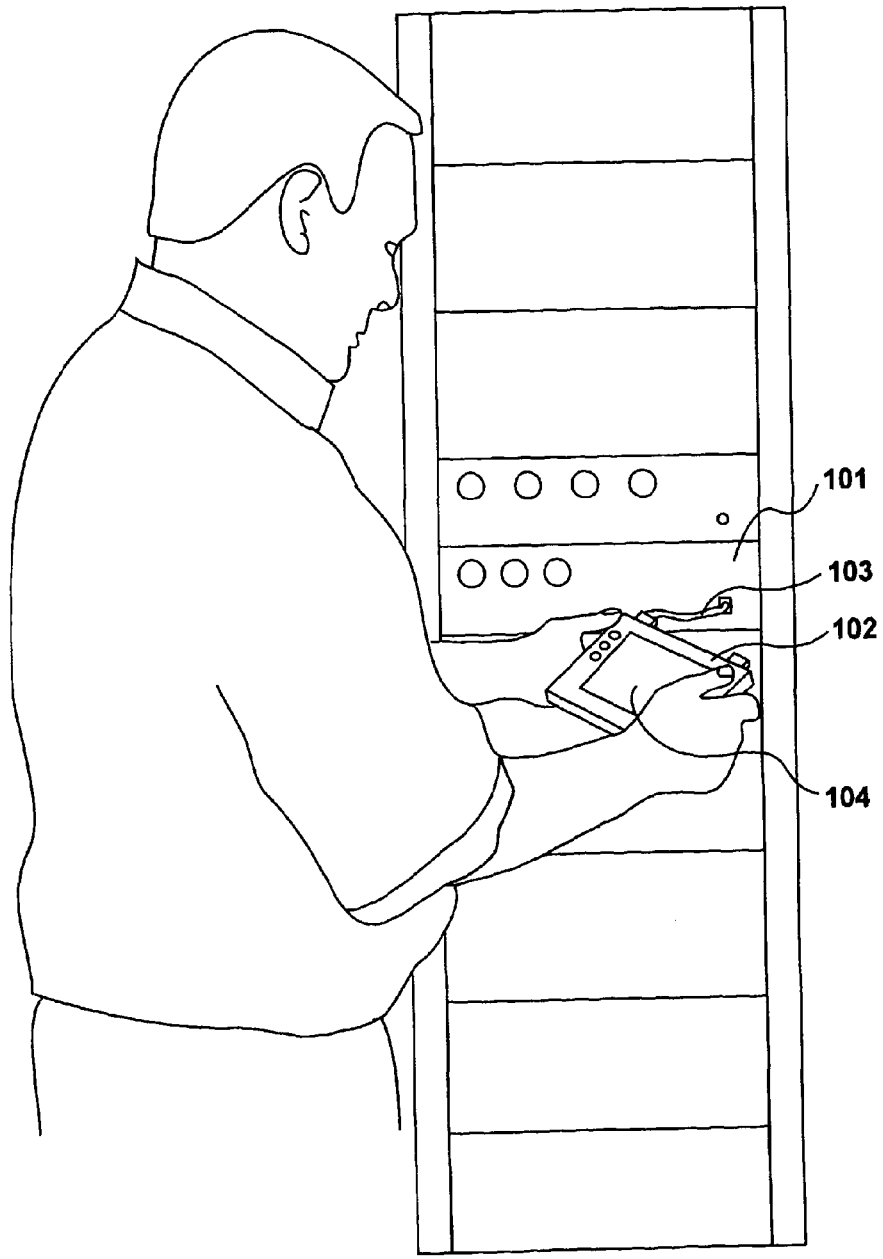
FIG. 1 shows an environment for evaluating the operation of a device under test.

An environment for evaluating the operation of a device under test is illustrated in FIG. 1. In this example, a device under test 101 is rack mounted and is configured to generate a serial digital video signal for high definition displays, being transmitted at a frequency of several gigahertz.

In the preferred environment, a jitter evaluation apparatus 102 is preferably hand held and receives digital video output from the device under test 101 via an appropriate coaxial cable 103.

The evaluation apparatus 102 includes a visual display 104 which may take the form of a color LCD display of the type used in note book computers or portable video games etc. Essentially, the display 104 provides information confirming that the jitter present in signals received from the device under test is within acceptable limits or, alternatively exceeds acceptable limits and as such cannot be deployed within the transmission network. It is also envisaged that the evaluation apparatus 102 would include additional procedures for testing other aspects of the transmission channel.

FIG. 2

Figure 2:
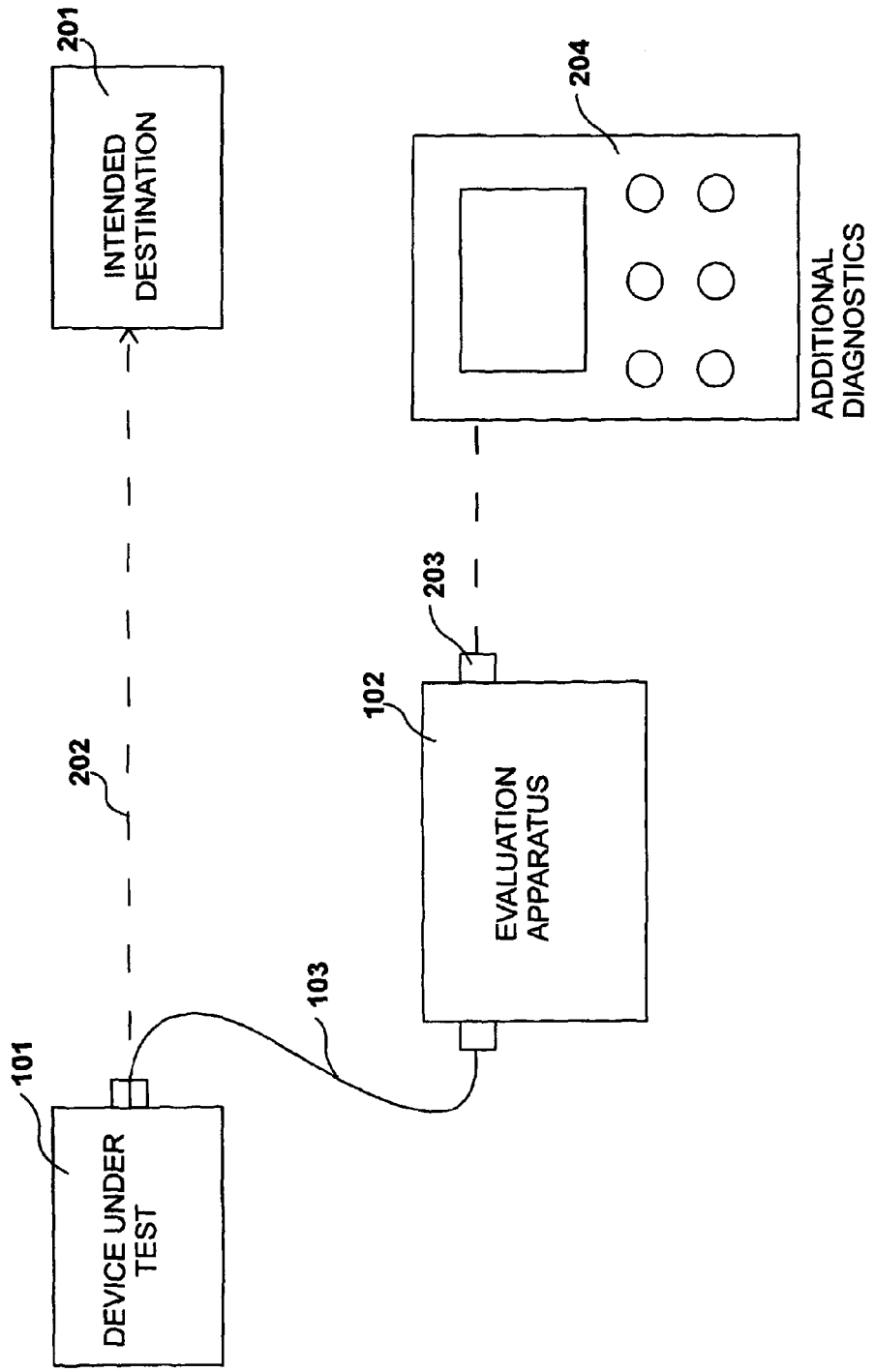
FIG. 2 shows a diagrammatic representation of the evaluation environment identified in FIG. 1, including an evaluation apparatus.

A diagrammatic representation of the evaluation apparatus 102 is shown in FIG. 2. Having passed appropriate tests, a device under test 101 may be connected to its intended destination 201 via an appropriate transmission channel 202. However, prior to this connection being made, an evaluation procedure is conducted by connecting the output from the device under test 101 to the evaluation apparatus 102 via the coaxial cable 103. The evaluation apparatus 102 measures timing jitter and alignment jitter and produces an appropriate output so that an operative may see that the levels of jitter present are within acceptable limits.

An output port 203 is also provided allowing the evaluation apparatus 102 to be connected to additional diagnostic apparatus 204. Thus, it is possible for the additional diagnostics apparatus 204 to consider, for example, jitter present within other frequency bands and in a preferred embodiment the additional diagnostics apparatus may includes an oscilloscope.

It is envisaged that the hand held evaluation apparatus 102 may be used to perform routine testing and be made available at substantially reduced costs such that it may be deployed in a routine manner. Thus, a device will be appropriate for testing real installations when equipment is installed or upgraded, in addition to testing prototypes and design proposals. However, when a more detailed testing and evaluation procedure is required, the evaluation apparatus 102 may again be deployed with connection to additional diagnostics 204 where appropriate.

FIG. 3

Figure 3:
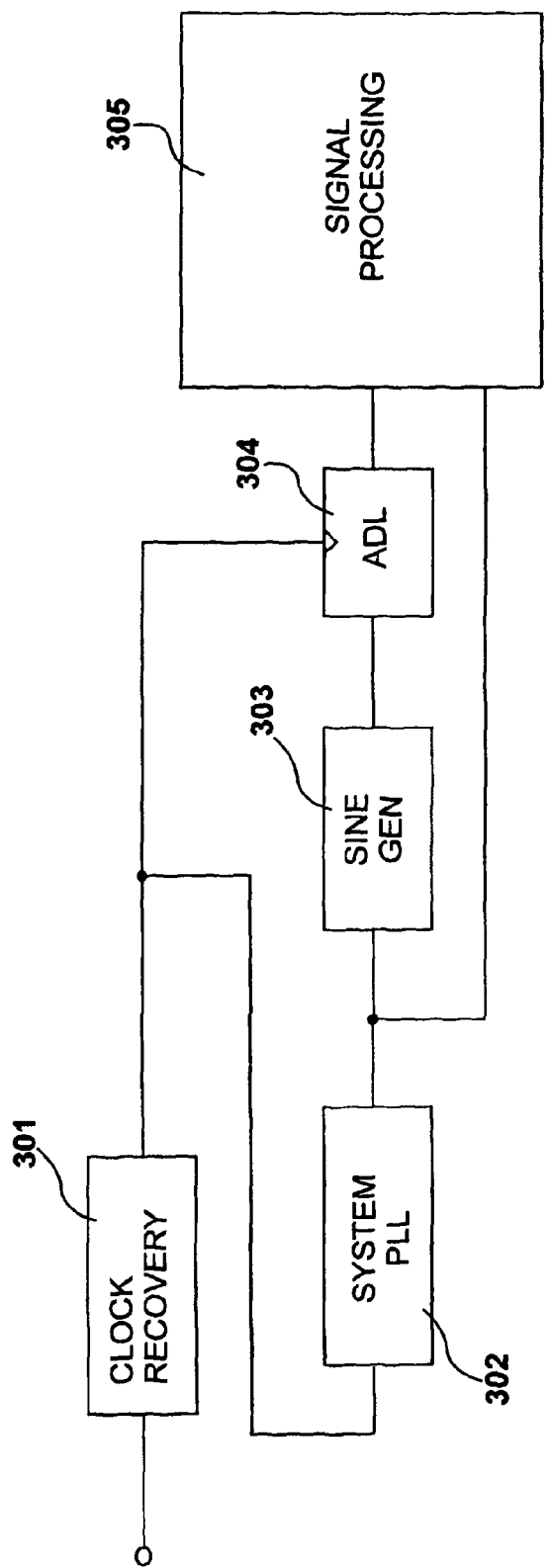
FIG. 3 illustrates a known approach to jitter evaluation.

A known approach to jitter evaluation is illustrated in FIG. 3. An input signal is supplied to a clock recovery circuit 301 for recovering a recovered clock signal from a test signal. During testing, it is typical for a standard test signal to be deployed, often that representing color bars, when considering digital video signals.

A synchronisation circuit 302, taking the form of a low bandwidth highly accurate system phase locked loop, is configured to generate an accurate system clock signal from the recovered clock signals. A sine wave generator 303 generates a sine wave in response to the system clock and this sine wave is then sampled by an analog to digital converter 304. The recovered clock signal is used to sample the sine wave such that the sampling points will vary in accordance with jitter present in the recovered clock signal. Thus, the absolute values of these samples (which vary sinusoidally) include a component derived from the inherent jitter. Thus, by supplying the samples to a signal processing environment 305 it is possible to make an assessment of the jitter present within the signal. However, known signal processing environments tend to be expensive and require complex calibration operations to be performed.

FIG. 4

Figure 4:
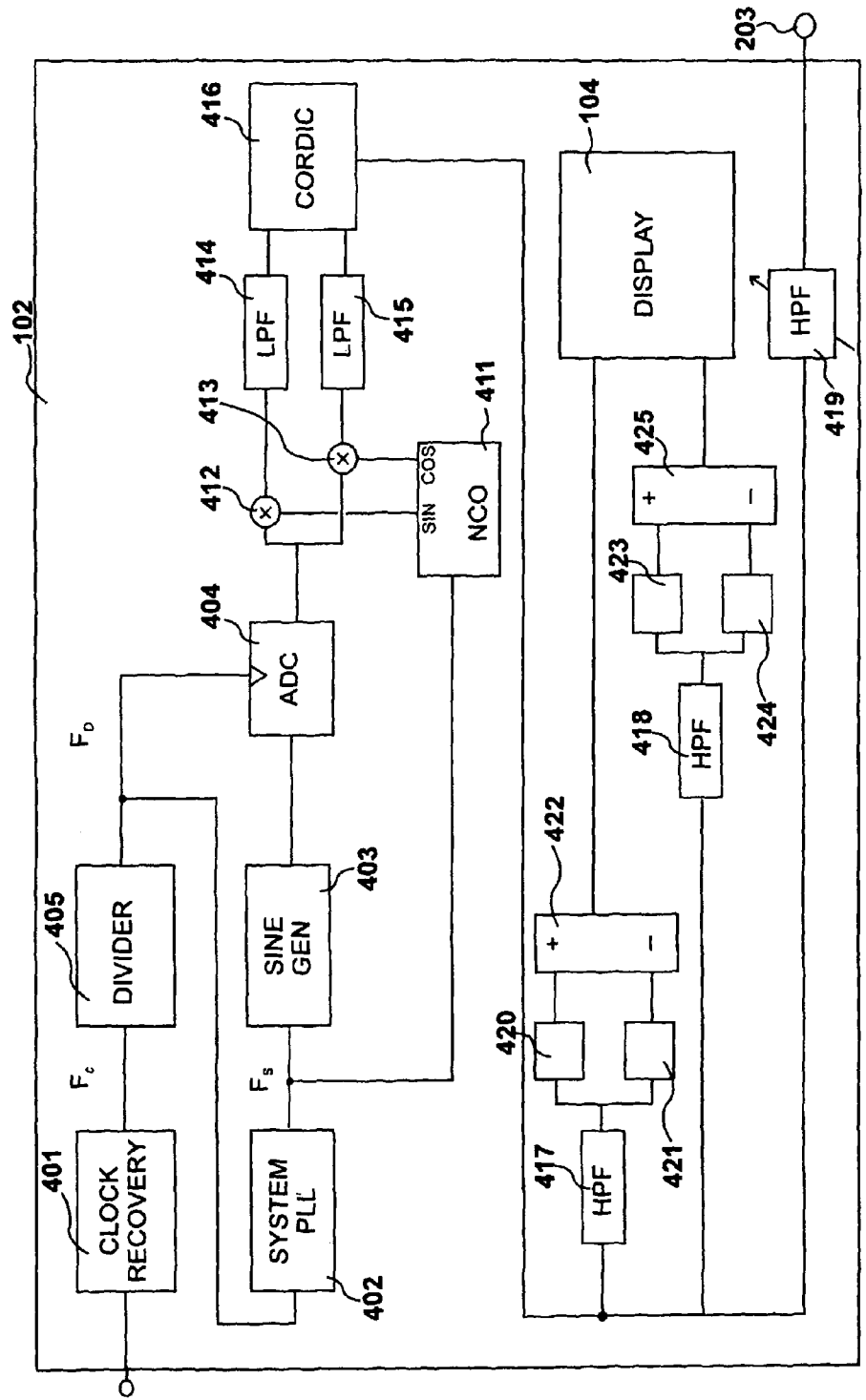
FIG. 4 details the evaluation apparatus identified in FIG. 1, embodying the present invention.

The evaluation apparatus 102 is illustrated in FIG. 4. In a preferred embodiment, the evaluation apparatus 102 includes a clock recovery circuit 401, a system phase locked loop synchronisation circuit 402, a sinusoid generator 403 and an analog to digital converter 404, substantially similar to the components illustrated and similarly referenced in FIG. 3.

The evaluation apparatus 102 is required to process a high frequency digital signal which, in a preferred embodiment, represents a high definition digital video signal, possibly operating at 3 GHz. Clock recovery circuit 401 recovers the clock signal at this high frequency but the recovered clock signal is then supplied to a divider 405 which divides the incoming clock samples to a more manageable frequency. Thus, in a preferred embodiment, the divider 405 may perform a divide by sixteen operation. Thus, the initial clock frequency $F_c$ may be 3 GHz and a divided clock frequency $F_d$ may be 187.5 MHz. From this, synchronisation circuit 402 generates a system clock signal of frequency $F_s$ at 187.5 MHz but synchronised using a low bandwidth high accuracy phase locked loop to substantially remove jitter contained within the digital signal. Thus, the system clock signal is then used to produce a synchronous sinusoid from sine generator 403 which is then sampled by the divided clock signal within analog to digital converter 404.

In a preferred embodiment, as illustrated in FIG. 4, a numerically controlled oscillator 411 receives an input from the system synchronisation circuit 402 (the synchronised clock signal) to produce sine values and cosine values that are in turn synchronised to the system clock and do not contain jitter components.

A first multiplier is configured to produce a first product of the sinusoid samples received from the converter 404 and the sine values received from the numerically controlled oscillator. Similarly, a second multiplier produces a second product of the sinusoid samples from the converter 404 and said cosine values from the numerically controlled oscillator. The product from multiplier 412 is supplied via a first low pass filter 414 to the co-ordinate rotation device 415. Similarly, the product from multiplier 413 is supplied to a co-ordinate rotation device 415 via a second low pass filter 415. It can therefore be shown that the co-ordinate rotation device 415 receives a first input that is proportional to the cosine of the clock frequency multiplied by peak-to-peak jitter along with a second input that is proportional to the sine of the clock frequency multiplied by the peak-to-peak jitter.

The co-ordination rotation device, also referred to as a CORDIC device as an acronym derived from Co-ordinate Rotation Digital Computer, allows trigonometric calculations to be performed (possibly in programmable gate array) without requiring hardware multipliers. In this application, it allows the phase angle to be derived from the sine and cosine inputs which in turn varies dependent upon jitter.

The phase output from CORDIC 416 is supplied to a first high pass filter 417, a second high pass filter 418 and a variable high pass filter 419. The output from variable high pass filter 419 provides output 203 for additional diagnostics. High pass filter 417 facilitates measurement of timing jitter, with high pass filter 418 being directed towards an evaluation of alignment jitter.

High pass filter 417 passes signals above 10 Hz and high value phase angles are latched by a first latch 420 with low values being latched by a second latch 421. A difference circuit 422 subtracts the low output from latch 421 from the high output from latch 420 to provide a peak-to-peak value that in turn is supplied to display 104.

The output from high pass filter 418 is again supplied to a high value latch 423 and a low value latch 424 from which a difference circuit 425 produces a difference representing peak-to-peak alignment jitter. Thus, high pass filter 418 in a preferred embodiment passes signals above 100 KHz.

The numerically controlled oscillator 411 allows the sine and cosine values to be produced at any frequency below the clock frequency. The output from CORDIC 416 represent phase that is independent of amplitude. Thus, if the clock oscillator is locked to a crystal output, it is not necessary to perform any calibration as it can be locked to the input derived from the synchronisation system phase locked loop. By adopting these measures, it is not necessary to perform calibration because the signals derived are absolute in terms of conveying the phase information. Thereafter, it is possible to derive any degree of precision given that this is dependent upon the number of bits used by the ADC 404 and the calculation processes. Thus, it is possible to use an internal digital oscillator to determine the absolute value as to where the clock should be at sample time.

The sine and cosine generation followed by low pass filtering allows the system to determine where the clock should be and Where it was actually seen. This co-ordinate information is then converted to phase, so as to produce an absolute phase value. By applying this phase information to a slow low pass filter and using that information to lock the system phase lock loop, it is possible to produce a comparator which can specify where zero phase should be, which would preferably be in the middle of the cycle.

If a sine wave is produced at one quarter of the analog to digital converter 404 clocking frequency, sampling will take place four times per cycle. By adopting this approach (in a preferred embodiment) the design of multipliers 412 and 413 may become substantially simpler. Given this constraint, the sine and cosine values will have amplitudes of zero, plus unity or minus unity. Thus, the multiplication takes the form of a change of sign. Furthermore, low pass filters 414 and 415 may take the form of decimation filters, requiring, say, a decimate by two. The low pass filter has a characteristic that when decimating, the approach will reduce the bandwidth and the clock rate of the signal. The incoming signal is filtered to prevent aliasing and it is possible to effectively discard half of the information and for the required information to be derived at half the sampling rate.

An implementation of the digital filters may use delay lines in which the centre tap is one half. Some co-efficients are zero therefore their components do not add to the result. In a preferred embodiment, every other tap is zero so it is possible for these to be removed. By making use of this feature, it is possible for the two input signals (derived from sine and cosine) to be multiplexed.

After multiplexed filtering, the signals are separated and then supplied to CORDIC 416, giving a substantial hardware saving. Further decimation could be implemented in order to improve signal to noise and precision. In the preferred embodiment, a twelve bit analog to digital converter is used and the output is put through a filter that reduces the bandwidth by four. This improves precision, effectively producing an output signal of fifteen bits for representing phase.

The invention claimed is:

1. Jitter evaluation apparatus for receiving a digital test signal from which a clock signal is recovered, comprising:
    a clock recovery circuit configured to recover a recovered clock signal from said digital test signal;
    a synchronisation circuit configured to generate a synchronised system clock signal from said recovered clock signal;
    a sinusoid generator configured to generate a sinusoid signal from said synchronised system clock signal; and
    a sampling analog to digital converter configured to sample said sinusoid signal by said recovered clock signal to provide sinusoid samples, further comprising:
    a numerically controlled oscillator configured to produce sine values and cosine values in response to receiving said synchronised system clock signal;
    a first multiplier configured to produce a first product of said sinusoid samples and said sine values;
    a second multiplier configured to produce a second product of said sinusoid samples and said cosine values; and
    a co-ordinate rotation device configured to receive said first product via a first low pass filter and to receive said second product via a second low pass filter, and to produce a phase signal that is indicative of jitter phase.

2. The apparatus as claimed in claim 1, wherein said digital test signal is received via a device under test so as to evaluate the acceptability of said device under test.

3. The apparatus as claimed in claim 2, wherein said device under test is a device for processing and/or transmitting high definition serial digital video data.

4. The apparatus as claimed in claim 1, including a frequency divider for dividing the frequency of said recovered clock signal from a clock recovery circuit so as to supply a divided clock signal to said synchronisation circuit and a sampling analog to digital converter.

5. The apparatus as claimed in claim 1, including sample and hold devices for evaluating peak-to-peak jitter for application to a display device.

6. A method of evaluating jitter, comprising the steps of:
    recovering a clock signal from a digital input signal;
    generating a synchronized system clock signal from said recovered clock signal;
    generating a sinusoid signal from said synchronised system clock signal;
    sampling said sinusoid signal by said recovered clock signal and providing sinusoid samples;
    producing sine values and cosine values in response to receiving said synchronized system clock signal;
    producing a first product of said sinusoid samples and said sine values;
    producing a second product of sinusoid samples and said cosine values; and
    producing a phase signal that is indicative of jitter phase by low pass filtering said first product and said second product, and supplying the resulting sine dependent and cosine dependent values to a co-ordinate rotation procedure.

7. The method as claimed in claim 6, wherein the frequency of said recovered clock signal is divided to generate a divided clock signal.

8. The method as claimed in claim 6, wherein peak-to-peak jitter is evaluated by receiving samples from sample and hold devices.

9. The apparatus as claimed in claim 1, including a first high pass filter for receiving said output to evaluate timing jitter.

10. The apparatus as claimed in claim 1, including a second high pass filter to evaluate alignment jitter.

11. The method as claimed in claim 6, wherein timing jitter is evaluated by receiving said phase information via a first high pass filter.

12. The method as claimed in claim 6, wherein alignment jitter is evaluated by receiving said phase signal via a second high pass filter.

13. The method of claim 6, further comprising evaluating timing jitter by performing a first high pass filter operation on said phase signal, and evaluating alignment jitter by performing a second high pass filter operation on said phase signal.

14. The apparatus of claim 1, further comprising a first high pass filter configured to receive said phase signal to evaluate timing jitter, and a second high pass filter configured to receive said phase signal to evaluate alignment jitter.

* * * * *